(12) United States Patent
Albert et al.

(10) Patent No.: US 11,703,681 B2
(45) Date of Patent: Jul. 18, 2023

(54) MEMS DEVICES COMPRISING SPRING ELEMENT AND COMB DRIVE AND ASSOCIATED PRODUCTION METHODS

(71) Applicant: Infineon Technologies AG, Neubiberg (DE)

(72) Inventors: Stephan Gerhard Albert, Munich (DE); Marten Oldsen, Anzing (DE)

(73) Assignee: Infineon Technologies AG, Neubiberg (DE)

( * ) Notice: Subject to any disclaimer, the term of this patent is extended or adjusted under 35 U.S.C. 154(b) by 18 days.

(21) Appl. No.: 17/302,938

(22) Filed: May 17, 2021

(65) Prior Publication Data
US 2021/0373322 A1    Dec. 2, 2021

(30) Foreign Application Priority Data
May 28, 2020    (DE) .......................... 102020114347.8

(51) Int. Cl.
    *B81C 1/00*      (2006.01)
    *G02B 26/08*      (2006.01)
    (Continued)

(52) U.S. Cl.
     CPC .......... *G02B 26/0841* (2013.01); *B81B 3/007* (2013.01); *B81B 3/0021* (2013.01);
    (Continued)

(58) Field of Classification Search
     CPC ................................................ B81C 1/00015
     See application file for complete search history.

(56) References Cited

U.S. PATENT DOCUMENTS

| | | | |
|---|---|---|---|
| 2004/0119125 A1* | 6/2004 | Gogoi ................. | B81C 1/00476 438/424 |
| 2011/0136283 A1* | 6/2011 | Gritters ............... | B81C 1/00182 257/E21.002 |

(Continued)

FOREIGN PATENT DOCUMENTS

| | | |
|---|---|---|
| DE | 102006058563 B3 | 6/2008 |
| DE | 102018211755 A1 | 1/2020 |

OTHER PUBLICATIONS

Gallagher et al., "A review of fabrication processes for vertical comb drives," Microsystem Technologies, vol. 18, 2012, pp. 381-397.

(Continued)

*Primary Examiner* — Moazzam Hossain
(74) *Attorney, Agent, or Firm* — Harrity & Harrity, LLP

(57) ABSTRACT

A method for producing a MEMS device comprises fabricating a first semiconductor layer and selectively depositing a second semiconductor layer over the first semiconductor layer, wherein the second semiconductor layer comprises a first part composed of monocrystalline semiconductor material and a second part composed of polycrystalline semiconductor material. The method furthermore comprises structuring at least one of the semiconductor layers, wherein the monocrystalline semiconductor material of the first part and underlying material of the first semiconductor layer form a spring element of the MEMS device and the polycrystalline semiconductor material of the second part and underlying material of the first semiconductor layer form at least one part of a comb drive of the MEMS device.

24 Claims, 7 Drawing Sheets

(51) Int. Cl.
*B81B 3/00* (2006.01)
*H01L 21/02* (2006.01)
(52) U.S. Cl.
CPC ........ *B81C 1/0019* (2013.01); *B81C 1/00063* (2013.01); *B81C 1/00373* (2013.01); *B81C 1/00682* (2013.01); *H01L 21/02595* (2013.01); *H01L 21/02598* (2013.01); *B81B 2201/033* (2013.01); *B81B 2201/042* (2013.01); *B81B 2203/0136* (2013.01); *B81B 2203/033* (2013.01)

(56) References Cited

U.S. PATENT DOCUMENTS

2012/0208343 A1* 8/2012 Sassolini ............. B81C 1/00484
　　　　　　　　　　　　　　　　　　　　　　 257/E21.249
2018/0356629 A1* 12/2018 Wang ................... A61B 5/0073

OTHER PUBLICATIONS

Lin et al., "A self-aligned fabrication method of dual comb drive using multilayers SOI process for optical MEMS applications," Microsystem Technologies, vol. 11, 2005, pp. 204-209.

* cited by examiner

MEMS DEVICES COMPRISING SPRING ELEMENT AND COMB DRIVE AND ASSOCIATED PRODUCTION METHODS

CROSS REFERENCE TO RELATED APPLICATION

This application claims priority to German Patent Application No. 102020114347.8 filed on May 28, 2020, the content of which is incorporated by reference herein in its entirety.

TECHNICAL FIELD

The present disclosure relates to MEMS devices comprising spring element and comb drive. Furthermore, the disclosure relates to methods for producing such MEMS devices.

BACKGROUND

MEMS (microelectromechanical system) devices can be for example LIDAR (Light Detection and Ranging) sensing devices, such as can be used in fully autonomous or partly autonomous self-driving automobiles. Here a movable MEMS micromirror of the sensing device can oscillate about a scanning axis, wherein light reflected from the MEMS micromirror and used for a scan of the surroundings oscillates back and forth.

BRIEF DESCRIPTION

In the case described above, large angular oscillation amplitudes and high oscillation frequencies may be desirable for high system performance and robustness vis a vis vibration but they can result in a high mechanical loading of the device components, in particular the spring elements. Implementations described herein relate to devices which may provide the abovementioned amplitudes and frequencies and at the same time are embodied mechanically robustly. Furthermore, implementations described herein may provide cost-effective methods for producing such devices. Various aspects relate to a method for producing a MEMS device. The method comprises fabricating a first semiconductor layer and selectively depositing a second semiconductor layer over the first semiconductor layer, wherein the second semiconductor layer comprises a first part composed of monocrystalline semiconductor material and a second part composed of polycrystalline semiconductor material. The method furthermore comprises structuring at least one of the semiconductor layers, wherein the monocrystalline semiconductor material of the first part and underlying material of the first semiconductor layer form a spring element of the MEMS device and the polycrystalline semiconductor material of the second part and underlying material of the first semiconductor layer form at least one part of a comb drive of the MEMS device.

Various aspects relate to a MEMS device. The MEMS device comprises a spring element, wherein the spring element is fabricated from a first semiconductor layer composed of first monocrystalline semiconductor material and a second monocrystalline semiconductor material grown epitaxially over the first semiconductor layer. The MEMS device furthermore comprises a comb drive, wherein at least one part of the comb drive is fabricated from the first semiconductor layer composed of first monocrystalline semiconductor material and a polycrystalline semiconductor material grown epitaxially over the first semiconductor layer.

BRIEF DESCRIPTION OF THE DRAWINGS

Methods and devices in accordance with the disclosure are explained in greater detail below with reference to drawings. The elements shown in the drawings are not necessarily rendered in a manner true to scale relative to one another. Identical reference signs may designate identical components.

DETAILED DESCRIPTION

The figures described below show MEMS devices and associated production methods in accordance with the disclosure. In this case, the devices and methods described may be illustrated in a general way in order to describe aspects of the disclosure qualitatively. The devices and methods described may have further aspects, which may not be illustrated in the respective figure for the sake of simplicity. However, the respective example may be extended by aspects described in connection with other examples in accordance with the disclosure. Consequently, explanations concerning a specific figure may apply equally to examples of other figures.

Figure 1:
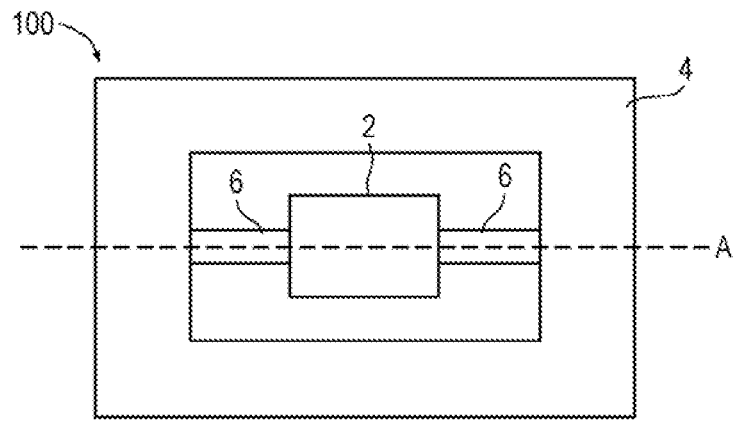
FIG. 1 shows a schematic plan view of a MEMS device 100 in accordance with the disclosure.

The MEMS device 100 in FIG. 1 can comprise a mirror body (or scanner body) 2, a frame 4 and suspension structures 6. The mirror body 2 can be configured to rotate about a pivoting axis or rotation axis A. The two suspension structures 6 situated opposite one another can mechanically connect the mirror body 2 to the frame 4. During operation of the MEMS device 100, the mirror body 2 can be driven such that it oscillates about the pivoting axis A. As a result, light reflected from the mirror body 2 can oscillate back and forth and can be used for sensing the surroundings. In this case, the light reflected from the mirror body 2 can be provided by a laser source, for example. In one example, the MEMS device 100 can be a LIDAR sensing device such as can be used for example in fully autonomous or partly autonomous self-driving automobiles.

The MEMS device 100 can comprise a drive (not shown) for driving the mirror body 2. In one example, such a drive can be embodied by one or more electrostatic comb drives that can be arranged at the mirror body 2. A comb drive can comprise first drive structures, e.g. comb structures with first comb electrodes, at the mirror body 2 and also second drive structures, e.g. comb structures with second comb electrodes, at the frame 4. Example comb structures or comb drives are shown and described in FIGS. 2 and 3. Drive signals, in particular periodically varying drive voltages, can be applied to the drive in order to cause the mirror body 2 to oscillate about the pivoting axis A.

Figure 2:
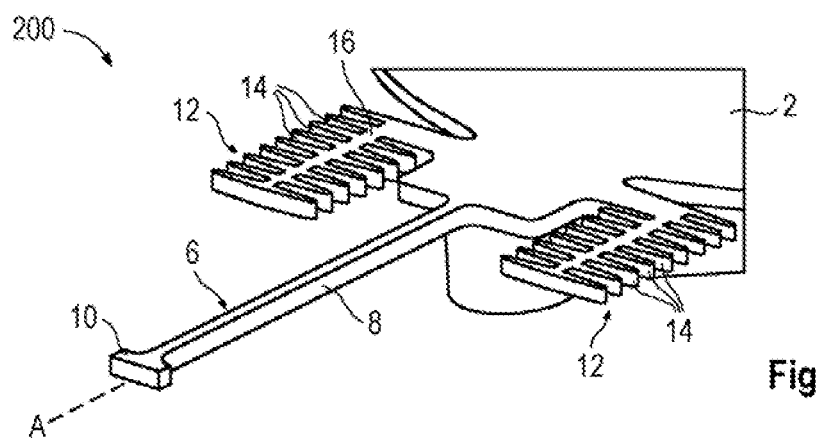
FIG. 2 shows a perspective view of a part of a MEMS device 200 in accordance with the disclosure.

FIG. 2 shows a part of a MEMS device 200, which can be regarded as a more detailed implementation of the MEMS device 100 from FIG. 1. The suspension structure 6 can comprise a spring element 8 in the form of a torsion bar. However, the suspension structure 6 is not limited to spring elements in the form of a torsion bar. The spring element 8 can have an end section 10, at which the suspension structure 6 can be secured to a frame (not shown). The spring element 8 can extend substantially parallel to the pivoting axis A of the mirror body 2 or define such an axis.

FIG. 2 shows by way of example two comb structures 12 of the MEMS device 200, which can be arranged to the left and right of the pivoting axis A. Each of the comb structures 12 can comprise a multiplicity of comb fingers 14, which, in the example in FIG. 2, can proceed from a central section 16 of the respective comb structure 12 and can extend substantially parallel to one another. In a further example, the comb fingers 14 can proceed from the central section 16 in only one direction. In yet another example, the comb fingers 14 can be attached directly to the mirror body 2, such that the central section 16 can be dispensed with. In practice, a comb structure 12 can comprise up to approximately one hundred or more comb fingers 14. The excerpt from the MEMS device 200 shown in FIG. 2 can substantially correspond to the left-hand part of FIG. 1. Accordingly, on an opposite side of the mirror body 2, which side is not illustrated in FIG. 2, in a symmetrical manner, the MEMS device 200 can comprise a further spring element 8 and also two further comb structures 12. In the example in FIG. 2, the MEMS device 200 can thus comprise four comb structures.

Figure 3A:
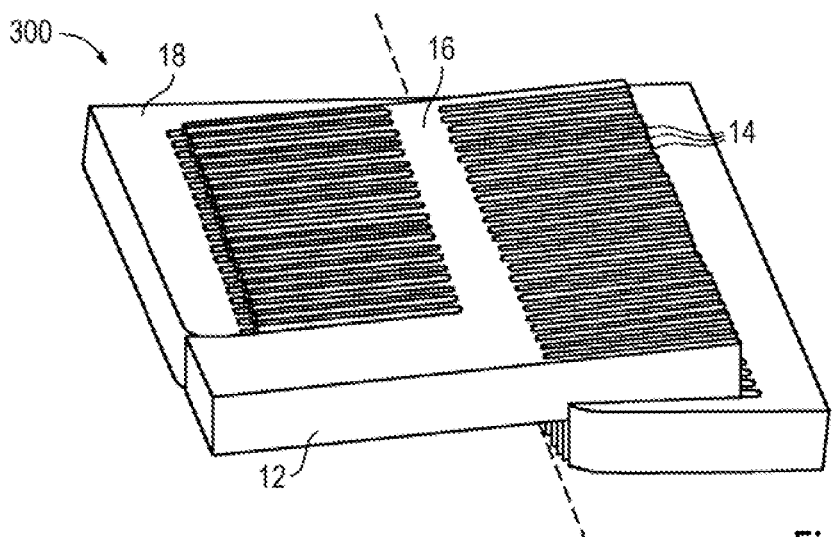
FIGS. 3A and 3B show a perspective view and a plan view of a comb drive 300, which can be part of a MEMS device in accordance with the disclosure.
Figure 3B:
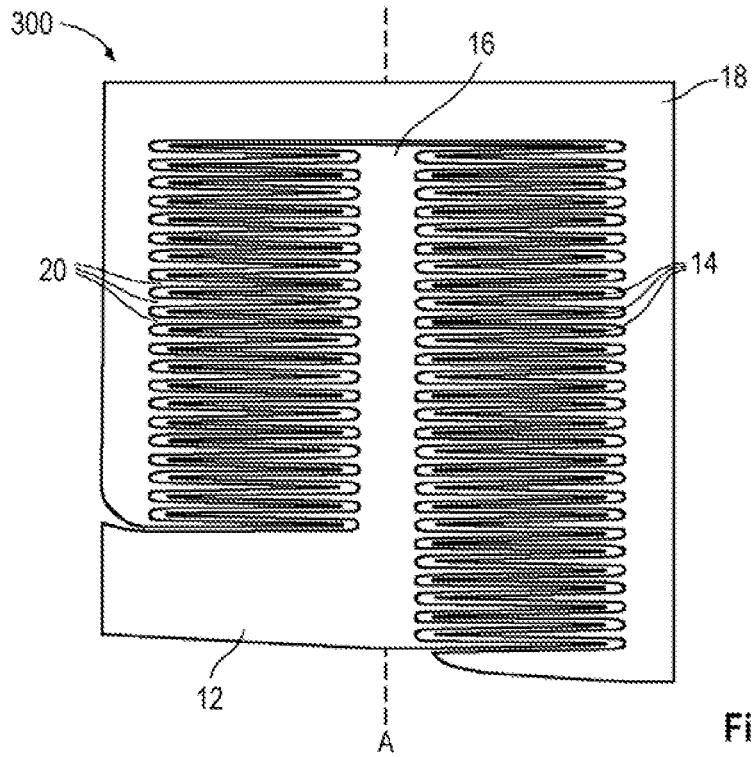

The comb drive 300 in FIGS. 3A and 3B can be used for an electrostatic control and a drive of a MEMS device in accordance with the disclosure. The comb drive 300 can comprise two (interdigital) comb structures 12 and 18. The first comb structure 12 can be secured to the oscillating MEMS sensing device or a mirror body and can be referred to as "rotor". Accordingly, the comb fingers 14 of the first comb structure 12 can be referred to as rotor comb fingers. The first comb structure 12 in FIGS. 3A and 3B can be similar to the comb structure 12 in FIG. 2. The second comb structure 18 can be secured to a frame (cf. FIG. 1), which can surround the oscillating MEMS sensing device. The second comb structure 18 or its comb fingers 20 can be referred to as "stator" or stator comb fingers. The rotor comb fingers 14 and the stator comb fingers 20 can be arranged offset with respect to one another such that they intermesh and enable an oscillation about the pivoting axis A.

The stator and rotor of the comb drive 300 can form electrodes of a capacitor. A (resonant) MEMS sensing device can be interpreted as a resonantly excited mass-spring-damping system. By applying an AC voltage U to the comb drive capacitor, e.g. between rotor and stator, it is possible to feed energy into the mass-spring-damper system. The voltage U can be, in particular, a unipolar AC voltage U having approximately double the mechanical natural resonant frequency of the MEMS sensing device. The oscillator can be driven to resonance by the applied AC voltage. In this case, the energy $\frac{1}{2}\,C\,U^2$ stored in the capacitor with a capacitance C can be coupled into the kinetic energy of the oscillator twice per oscillation cycle.

Besides resonantly operated MEMS sensing devices, there are also quasi-statically operated MEMS sensing devices comprising an electrostatic comb drive. In the case of the latter devices, by applying a voltage U to the comb structure on one side relative to the pivoting axis, e.g. the right-hand side, it is possible to exert a torque on the mirror body 2. As a result, the mirror body 2 can deflect as far as an angle at which the restoring torque generated by the spring elements 8 is equal to the electrostatically generated torque. If the voltage U is applied to the comb structure on the other side relative to the pivoting axis, the mirror body 2 deflects in the opposite direction. This operation uses a topology of stator and rotor fingers in which, in the rest position, the electrostatically generated torque does not vanish or is high enough, as is shown and described further below in association with FIGS. 6D and 6E. Moreover, consideration should be given to ensuring that the rate at which the voltage U is changed in order to scan different angles is low enough so as to avoid resonant excitation of the mass-spring-damper system. That means, in particular, that the rate of change of U should be significantly less than the resonant frequency of the mass-spring-damper system, which in turn makes it desirable in this case, too, to have high spring stiffnesses for high natural frequencies.

Figure 4:
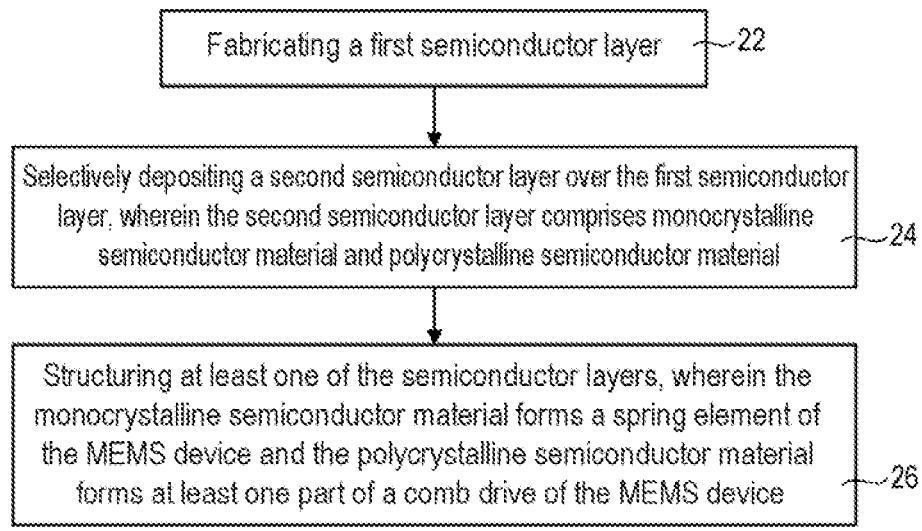
FIG. 4 shows a flow diagram of a method in accordance with the disclosure.

The method in FIG. 4 is illustrated in a general way in order to describe aspects of the disclosure qualitatively. The method can have further aspects, which are not shown and described in FIG. 4 for the sake of simplicity. For example, the method can be extended by one or more of the aspects described in connection with the method in FIGS. 5A-5H.

At 22, a first semiconductor layer can be fabricated. At 24, a second semiconductor layer can be selectively deposited over the first semiconductor layer. The second semiconductor layer can comprise a first part composed of monocrystalline semiconductor material and a second part composed of polycrystalline semiconductor material. At 26, at least one of the semiconductor layers can be structured. In this case, the monocrystalline semiconductor material of the first part and underlying material of the first semiconductor layer can form a spring element of the MEMS device. In this case, the polycrystalline semiconductor material of the second part and underlying material of the first semiconductor layer can form at least one part of a comb drive of the MEMS device.

Figure 5A:
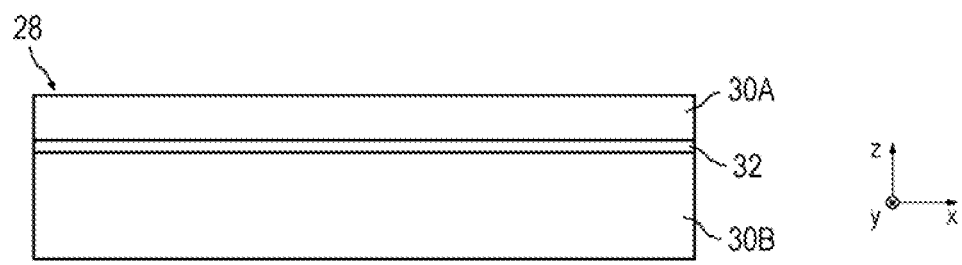
FIGS. 5A-5H show schematic cross-sectional side views of a method for producing a MEMS device 500 in accordance with the disclosure.

The method in FIGS. 5A-5H can be regarded as a more detailed implementation of the method in FIG. 4. In FIG. 5A, a first semiconductor layer 30 comprising partial layers 30A and 30B can be fabricated. The semiconductor materials described herein can be silicon, for example. In the example in FIG. 5A, the first semiconductor layer 30 can be a semiconductor wafer 28, which can be fabricated for example based on an SOI (Silicon on Substrate) technology. The SOI wafer 28 can be constructed from a plurality of semiconductor layers and insulation layers arranged one above another. FIG. 5A shows by way of example two semiconductor layers 30A, 30B and a dielectric layer 32 therebetween. In further examples, the SOI wafer can comprise further semiconductor layers and insulation layers.

The semiconductor layers 30A and 30B can in particular be fabricated from monocrystalline semiconductor material and have different dopings. The upper semiconductor layer 30A can be referred to as highly doped layers. Device structures, in particular MEMS structures, can be formed in the highly doped layer 30A. The layer 30A can thus also be referred to as device layer. The highly doped layer 30A can provide the function of sensing, inter alia, in a MEMS device. In this case, tiny deflections of movable MEMS structures can be capacitively detected with the aid of low voltages and/or low currents and be processed further. A thickness of the upper semiconductor layer 30A can be in a range of approximately 10 micrometers to approximately 70 micrometers. The semiconductor layer 30B arranged under the highly doped semiconductor layer 30A can be referred to as a lightly doped layer or "handle layer". In particular, a doping of the highly doped semiconductor layer 30A can be greater than a doping of the lightly doped semiconductor layer 30B. A thickness of the lower semiconductor layer 30B can be in a range of approximately 150 micrometers to approximately 400 micrometers.

Figure 5B:
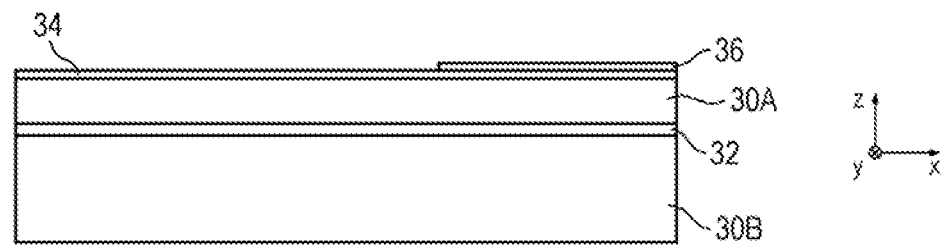

In FIG. 5B, a first insulation layer 34 can be deposited over the top side of the upper semiconductor layer 30A. The first insulation layer 34 can be an oxide layer, for example. In the example in FIG. 5B, the first insulation layer 34 can substantially completely cover the semiconductor layer 30A. The first insulation layer 34 can have a thickness of a few hundred nanometers in the z-direction, that is to say for example a thickness in a range of approximately 300 nanometers to approximately 3 micrometers. In this case the thickness of the first insulation layer 34 can be substantially constant over its entire extent in the x-y-plane.

A polysilicon layer 36 can be deposited over the top side of the first insulation layer 34. In one example, the polysilicon layer 36 can firstly be deposited over a large area and then be structured. Depositing the polysilicon layer 36 can be based on a CVD (Chemical Vapor Deposition) method, for example. As described further below, the structured sections of the polysilicon layer 36, in the MEMS device to be produced, can provide electrical connections between components of a stator and/or to electrical contact pads.

Figure 5C:
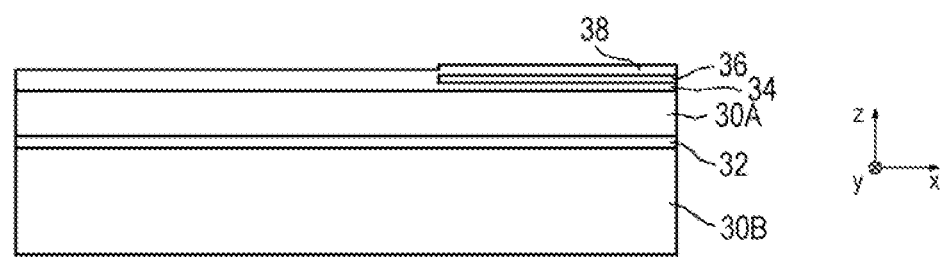

In FIG. 5C, a second insulation layer 38 can be deposited over the first insulation layer 34 and the polysilicon layer 36. The second insulation layer 38 can be an oxide layer, for example. In the example in FIG. 5C, the second insulation layer 38 can substantially completely cover the first insulation layer 34 and the polysilicon layer 36. A thickness of the second insulation layer 38 in the z-direction can be in a range of approximately 100 nanometers to approximately 3 micrometers.

Figure 5D:
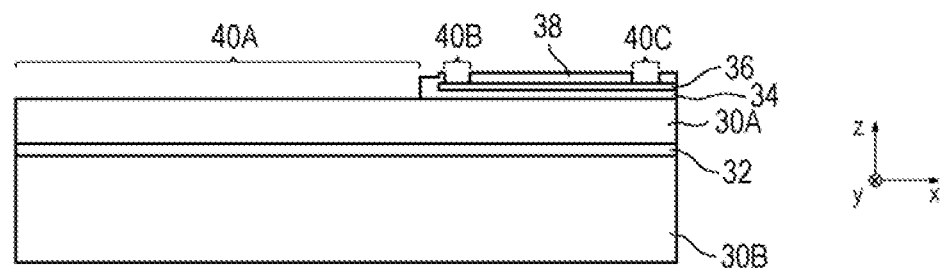

In FIG. 5D, the first insulation layer 34 and the second insulation layer 38 can be structured. In this case, the structuring of the two insulation layers can be carried out in particular simultaneously or in an identical method step. In FIG. 5D, the insulation material can be removed for example at three sections 40A to 40C. At a first section 40A, the insulation material can be completely removed and the surface of the semiconductor layer 30A can be exposed. In a later method step, monocrystalline semiconductor material can be deposited over these exposed sections of the semiconductor layer 30A. Accordingly, the insulation material can be removed in particular at such locations at which monocrystalline structures are intended to be provided in the MEMS device to be produced. By way of example, the first section 40A can comprise such locations at which a mirror body or a spring element of the MEMS device to be produced is intended to be formed later. At a second section 40B and a third section 40C, the insulation material of the second insulation layer 38 can be removed and surfaces of the polysilicon layer 36 can be exposed. Polycrystalline semiconductor material can be deposited over these sections in a later method step. The insulation material can remain at such locations at which electrical insulation between components of the MEMS device to be produced is intended to be provided.

Figure 5E:
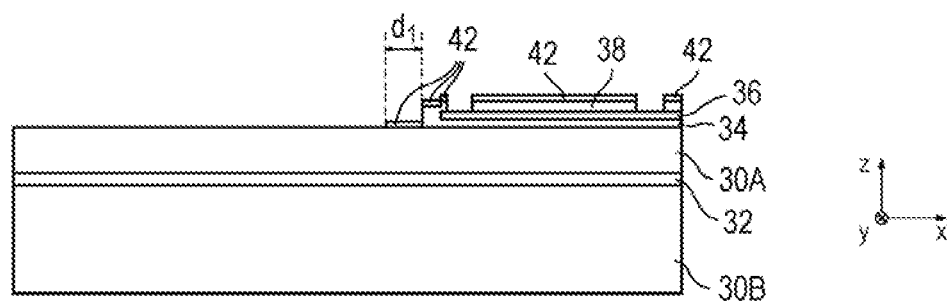

In FIG. 5E, a seed layer 42 can be deposited over the top side of the second insulation layer 38 and a section of the first semiconductor layer 30A. The seed layer 42 can be a polysilicon layer, for example, the deposition of which can be based on a CVD method, for example. The seed layer 42 can be deposited in particular at such locations over which polycrystalline semiconductor material is intended to be deposited in a later method step. The seed layer 42 can extend beyond the insulation material 34 and 38 by a distance $d_1$ and can be deposited partly over the first semiconductor layer 30A. The distance $d_1$ of this deposited part of the seed layer 42 can be in a range of approximately 100 nanometers to approximately 10 micrometers.

Figure 5F:
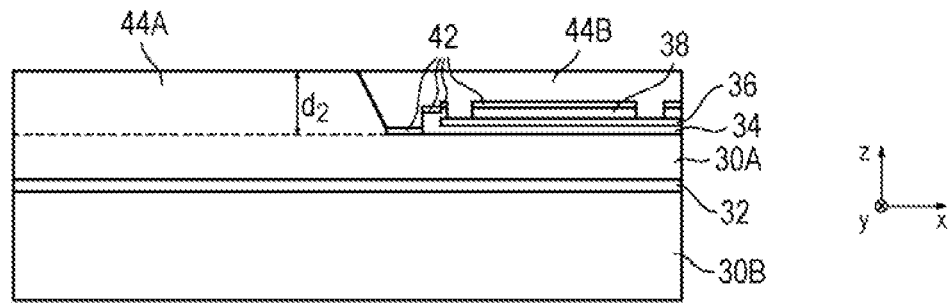

In FIG. 5F, a second semiconductor layer 44 can be deposited over the top side of the arrangement from FIG. 5E. The second semiconductor layer 44 can comprise a first part 44A composed of monocrystalline semiconductor material and a second part 44B composed of polycrystalline semiconductor material. In the example in FIG. 5F, the second semiconductor layer 44 can be deposited by simultaneously epitaxially growing the monocrystalline semiconductor material over the top side of the first semiconductor layer 30A and the polycrystalline semiconductor material over the top side of the seed layer 42 and the top side of the polysilicon layer 36. The monocrystalline semiconductor material can grow in particular on the locations at which the underlying monocrystalline semiconductor layer 30A was previously exposed. The polycrystalline semiconductor material can grow in particular on the locations at which the seed layer 42 forms the topmost layer of the arrangement. In one example, the polycrystalline semiconductor material can be epitaxial polysilicon. Epitaxial polysilicon can be substantially polysilicon having a large grain size, which can grow in an epitaxy reactor, in contrast to polysilicon, which can be deposited using a CVD method, for example. A dimension $d_2$ of the second semiconductor layer 44 in the z-direction can be in a range of approximately 10 micrometers to approximately 80 micrometers. Possible topographies (different heights) can be removed by CMP (chemical mechanical polishing) (not shown).

Figure 5G:
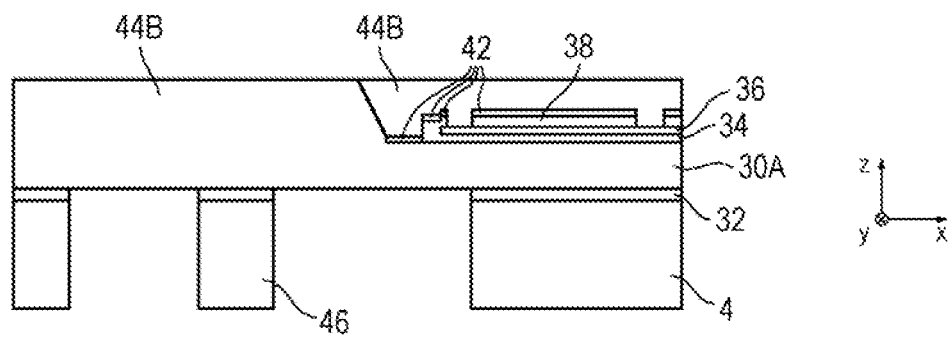

In FIG. 5G, the rear side of the arrangement from FIG. 5F can be structured. In this case, the lower semiconductor layer ("handle layer") 30B of the SOI wafer 28 and the overlying dielectric layer 32 can be removed at selected locations. The rear-side structuring makes it possible to form a frame 4 as shown and described in FIG. 1. Furthermore, structuring the semiconductor layer 30B makes it possible to form one or more stiffening structures 46 for mechanically stabilizing the MEMS device to be produced against dynamic deformations during resonant operation. In the example in FIG. 5G, the frame 4 and/or the stiffening structure 46 can be fabricated completely from monocrystalline semiconductor material.

Figure 5H:
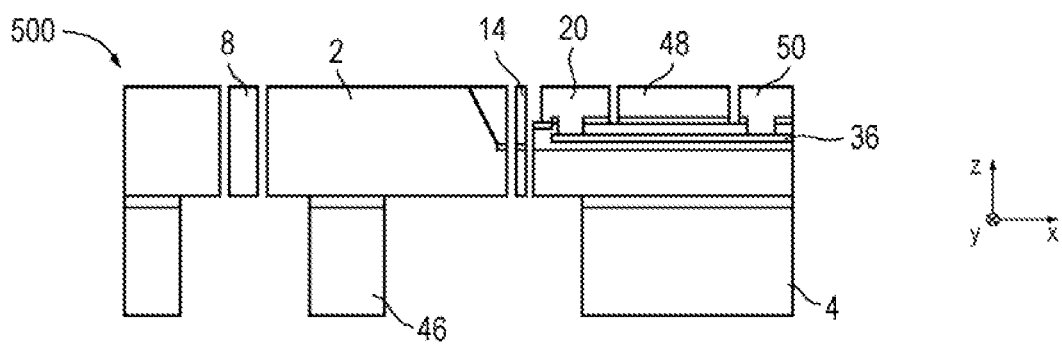

In FIG. 5H, the front side of the arrangement from FIG. 5G can be structured. A plurality of components of the MEMS device 500 that are described below can be formed in this case. In one example, the structuring can comprise an etching process, in particular trench etching. By way of example, the insulation layer 38 can function as an etch stop layer during the trench etching.

The front-side structuring in FIG. 5H makes it possible to form a spring element 8 of the MEMS device 500. The spring element 8 can be fabricated completely from monocrystalline semiconductor material. In particular, the spring element 8 can be formed from the monocrystalline semiconductor material of the semiconductor layer 30A and the monocrystalline semiconductor material 44A grown thereon. The MEMS device 500 can be configured to operate as a MEMS scanner. For the operation of a MEMS scanner, large angular oscillation amplitudes and high oscillation frequencies may be desirable, which can result in a high mechanical loading of the spring element 8, inter alia. Conventional spring elements can usually be constructed from a silicon-oxide-silicon layer stack. At the interfaces of the layers stacked one above another, mechanical loadings, in particular shear stresses, can result in material damage. In contrast thereto, the spring element 8 fabricated completely from monocrystalline semiconductor material in accordance with the disclosure cannot have such interfaces, and so the material damage cannot occur. The monocrystalline semiconductor material of the spring elements 8 can provide high mechanical strength and high fracture toughness. Mechanical failure (e.g. as a result of material cracks or material fractures) of the spring element 8 can be avoided as a result.

A mirror body 2 can be formed using the front-side structuring in FIG. 5H. Using the structuring, the mirror body 2 can be freed at the locations at which an anisotropic etching used for the structuring affects only the semiconductor material, e.g. where the insulation layer was removed. The mirror body 2 can be fabricated substantially completely from monocrystalline semiconductor material. In FIG. 5F, monocrystalline semiconductor material 44A was deposited at the locations of the mirror body 2 to be formed. In further examples, polycrystalline semiconductor material 44B can be grown instead at these locations (in particular on a seed layer). The polycrystalline semiconductor material grown can be removed again, wherein an underlying insulation layer can function as an etch stop layer during an etching process. Afterward, the insulation layer can likewise be removed, wherein the first semiconductor layer 30A can be exposed. The mirror body 2 can then be formed by structuring the exposed first semiconductor layer 30A. In comparison with FIG. 5H, a mirror body 2 fabricated in this way can have a smaller dimension in the z-direction, e.g. can be thinner and lighter.

At least one rotor comb finger 14 of the comb drive can be formed using the front-side structuring in FIG. 5H. The rotor comb finger 14 can be fabricated by way of a layer stack composed of the monocrystalline semiconductor material of the semiconductor layer 30A and the polycrystalline semiconductor material 44B. In the example in FIG. 5H, in the layer stack a dimension of the polycrystalline semiconductor material in the z-direction and a dimension of the monocrystalline semiconductor material in the z-direction can be substantially identical. The rotor comb finger 14 can optionally have residual portions of the seed layer 42. In FIG. 5F, polycrystalline semiconductor material 44B was deposited at the locations of the rotor comb finger 14 to be formed. In further examples, monocrystalline semiconductor material 44A can be deposited instead at these locations on the semiconductor layer 30A. In this case, at least one rotor comb finger 14 of the comb drive can be formed which can be fabricated completely from monocrystalline semiconductor material.

At least one stator comb finger 20 of the comb drive can be formed using the front-side structuring in FIG. 5H. In this case, the stator comb finger(s) 20 can be fabricated by way of a layer stack composed of the polycrystalline semiconductor material 44B, material of the insulation layers 34, 38 and monocrystalline semiconductor material of the semiconductor layer 30A. In the layer stack, the dimension of the polycrystalline semiconductor material in the z-direction and the dimension of the monocrystalline semiconductor material in the z-direction can be chosen flexibly by corresponding adaptation of the method steps described above. Example stator-rotor topologies with stator comb fingers embodied in various ways are shown and described in FIGS. 6A to 6E.

One or more mechanical contact pads 48 can be formed using the front-side structuring in FIG. 5H. A mechanical contact pad 48 can be configured to be mechanically connected to a housing (not shown), which can at least partly encapsulate the components of the MEMS device 500. The housing can be configured to protect the encapsulated components against external influences, such as, for example, moisture, leakage currents, ambient pressure changes, particles, or mechanical impacts. Protection against ambient pressure changes may be important in particular for a defined MEMS pressure and, as a result, a defined mechanical damping. In one example, the housing can be connected to the mechanical contact pad 48 using a bonding process.

One or more electrical contact pads 50 can be formed using the front-side structuring in FIG. 5H. An electrical contact pad 50 can be configured to electrically contact at least one stator comb finger 20 of the comb drive. In the example in FIG. 5H, an electrical connection between the stator comb finger 20 and the electrical contact pad 50 can be provided via the polysilicon layer 36. Via the contact pad 50, therefore, the stator part of the comb drive can be contacted and be controlled or driven for example by control signals. In particular, an electrical potential that can differ from the electrical potential present at the monocrystalline layer can be applied to the polycrystalline material of the stator comb finger 20. In one example, the electrical contact pad 50 can be electrically contacted by a bond wire using a bonding process.

It is evident from FIG. 5H that the MEMS device 500 can comprise a comb drive, wherein at least one part of the comb drive is fabricated from monocrystalline semiconductor material and polycrystalline semiconductor material grown epitaxially thereover. In this case, the polycrystalline material of the stator comb finger 20, the polycrystalline material of the electrical contact pad 50 and the polycrystalline material of the mechanical contact pad 48 can be electrically insulated from one another. These components can form polysilicon islands on their top side, which islands can be electrically insulated from one another by the trenches formed therebetween.

It should be noted that in practice the MEMS device 500 can have mechanical connections between its components that may not be discernible in FIGS. 5A-5H on account of the perspective chosen. By way of example, the spring element 8 is illustrated as a separate or isolated component in the view in FIG. 5H, which component is not mechanically connected to other components of the MEMS device 500. It is clear, however, that in practice the spring element 8 can be mechanically connected to the mirror body 2 and the frame 4, as is shown and described in FIG. 1, for example. The cross-sectional views in FIGS. 5A-5H are intended to demonstrate fundamental topological possibilities which can be realizable in a MEMS device in accordance with the disclosure. It should be noted in this context that a MEMS device in accordance with the disclosure need not necessarily have a (single) sectional plane that can provide cross-sectional side views in accordance with FIGS. 5A-5H. Rather, the cross-sectional side views in FIGS. 5A-5H may result from a meandering section through a MEMS device in accordance with the disclosure.

The production of only one MEMS device 500 is shown and described in the example method in FIGS. 5A-5H, for the sake of simplicity. In actual fact the method in FIGS.

5A-5H can be carried out at the wafer level or in the form of a cost-effective batch process. In this case, one or more of the method steps described can be carried out at the wafer level. The MEMS device 500 can thus also be referred to as a wafer level device. After the method steps in FIGS. 5A to 5H, the semiconductor wafer can be singulated into a multiplicity of MEMS devices 500 using a singulation process. By way of example, a mechanical dicing process and/or a stealth dicing process can be applied in this context.

FIGS. 6A to 6E schematically show various stator-rotor topologies such as can occur in MEMS devices in accordance with the disclosure. As is evident from FIG. 5H, in accordance with the disclosure, the lower part of a stator comb structure or of a stator comb finger 20 can consist of the material of the original device layer of the SOI wafer. The lower part can thus be electrically connected to the rotor comb structure since the entire device layer can be situated in an electrical path connection. However, the upper layer of the stator comb structure or of the stator comb finger 20 can be electrically insulated. As a result, an electrical voltage U can be applied between the upper stator layer, fabricated from epitaxial polysilicon, for example, and the rotor. In this case, it may be possible to vary the relative thickness of the epitaxial polysilicon layer and of the device layer. A variety of variations are shown in FIGS. 6A to 6E.

Figure 6A:
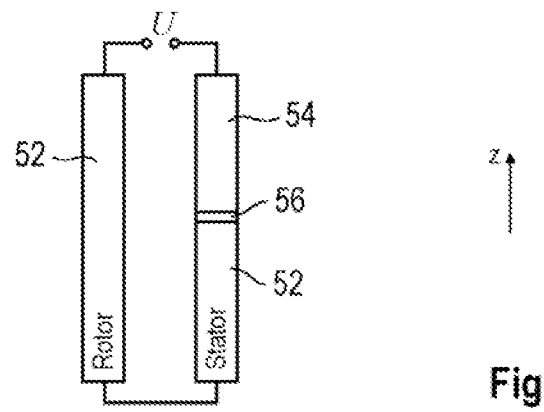
FIGS. 6A-6E show different stator-rotor topologies which can occur in MEMS devices in accordance with the disclosure.

In the case of the stator-rotor topology in FIG. 6A, the rotor or the rotor comb fingers can be fabricated completely from monocrystalline semiconductor material 52. The stator or the stator comb fingers can be fabricated from a layer stack, consisting of monocrystalline semiconductor material 52, insulation material 56 and polycrystalline semiconductor material 54. In the example in FIG. 6A, the heights of the layers 52 and 54 of the stator in the z-direction can be substantially identical. The greater the height of the layer 52 and/or the smaller the height of the layer 54 of the stator, the weaker a drive of the MEMS device by the comb drive can turn out to be, but the more accurately a closed-loop control of the comb drive can be effected. Accordingly, the topology of FIG. 6A shows a balanced solution in which the drive strength and the closed-loop control are weighted substantially equally.

Figure 6B:
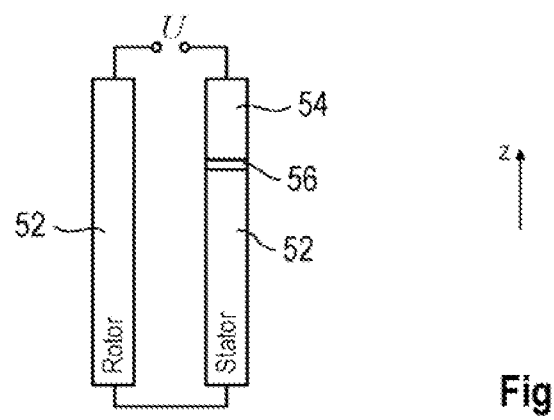

In the case of the stator-rotor topology in FIG. 6B, the height of the monocrystalline layer 52 can be greater than the height of the polycrystalline layer 54. Such a solution can give the closed-loop control quality of the comb drive a greater weight than the drive strength.

Figure 6C:
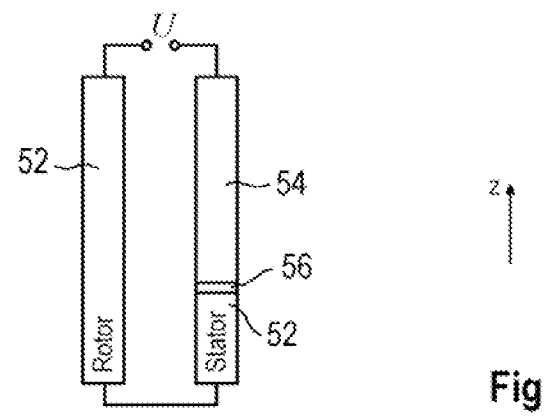

In the case of the stator-rotor topology in FIG. 6C, the height of the monocrystalline layer 52 can be less than the height of the polycrystalline layer 54. Such a solution can give the drive strength a greater weight than the closed-loop control quality of the comb drive.

Figure 6D:
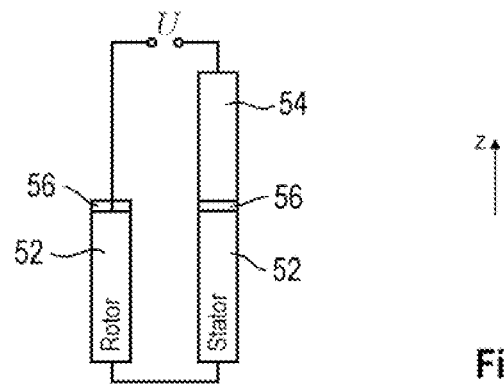

In the case of the stator-rotor topology in FIG. 6D, the stator can be embodied substantially as in FIG. 6A. In the example in FIG. 6D, a polycrystalline layer deposited on the top side of the rotor comb finger may have been removed again by leaving the insulation material 56 (e.g. an oxide) and etching the polycrystalline layer at these locations. It is thereby possible to form comb drives in which the rotor comb fingers and the stator comb fingers have different dimensions in the z-direction. Such a topology makes it possible to produce a MEMS scanner operated quasi-statically (that is to say not resonantly), since in this topology a sufficiently high torque can be generated even in the rest position by applying a voltage U to the comb drives on one of the two sides of the axis. Using suitable voltage profiles, e.g. ramps, step functions, etc., and using alternate application to the left and right comb structures, the mirror body can thus be pivoted to both positive and negative angles in quasi-static operation.

Figure 6E:
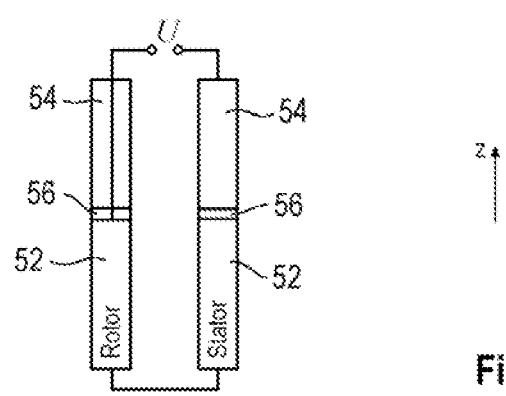

The stator-rotor topology in FIG. 6E can be at least partly similar to the stator-rotor topology in FIG. 6D. In contrast to FIG. 6D, in FIG. 6E a polycrystalline layer 54 can be arranged over the insulation material 56. The rotor finger and the stator finger can thus be formed identically. The voltage U can be present between the upper stator layer 54 and the lower rotor layer 52.

Figure 7:
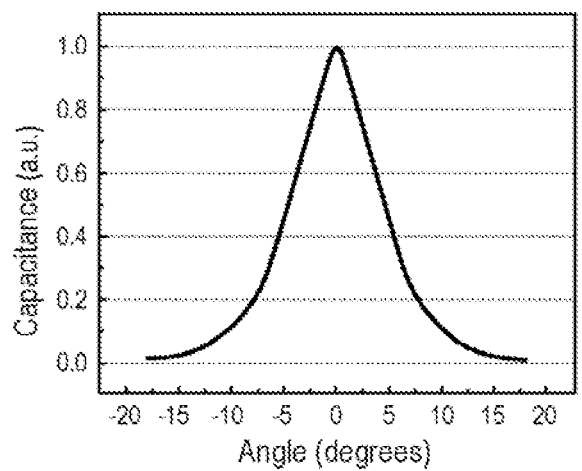
FIG. 7 shows the capacitance of a conventional comb drive as a function of the deflection angle of the comb drive.

FIG. 7 shows the capacitance of a conventional comb drive as a function of the deflection angle of the comb drive. In conventional comb drive structures, the rotor and the stator can both be formed from only one layer of identical thickness. On account of the symmetry for positive and negative deflection angles, such comb drives can have a symmetrical capacitance dependence around the zero angle, as is shown by way of example in FIG. 7.

Figure 8:
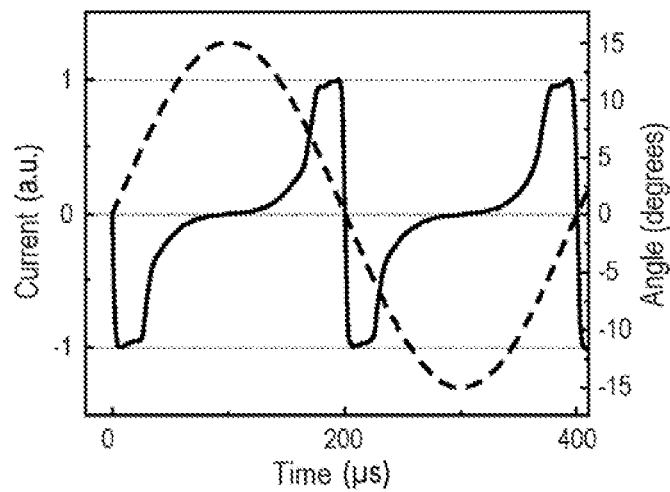
FIG. 8 shows a current signal of a conventional comb drive with symmetrical capacitance dependence.

FIG. 8 shows a current signal of a comb drive of a conventional MEMS device with a symmetrical capacitance dependence (cf. FIG. 7). In this case, a solid line shows the current signal and a dashed line shows the deflection angle of the comb drive. For identifying position/amplitude of the oscillating system, the capacitance or a variable derived therefrom can be measured. In one example, the derived variable can be the currents that charge and discharge the capacitor during the oscillation. A symmetrical capacitance dependence (cf. FIG. 7) can result in a symmetrical signal for the position/amplitude detection, as is shown by way of example in FIG. 8. The charging currents when the MEMS scanner approaches the zero or rest position from positive angles can be identical to those when the scanner approaches from negative angles. In an analogous manner, the discharge currents when the MEMS scanner moves from the zero position in the direction of higher (positive) angles can be identical to those when the scanner moves from the zero position in the direction of lower (negative) angles. It is evident from FIG. 8 that it is not possible to differentiate between positive and negative angles in the measurement of variables from a symmetrical capacitance dependence.

Figure 9:
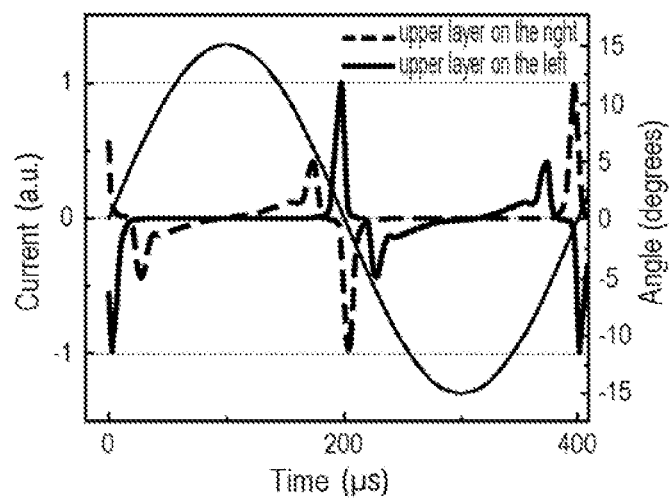
FIG. 9 shows a current signal of a comb drive of a MEMS device in accordance with the disclosure.

FIG. 9 shows a current signal of a comb drive of a MEMS device in accordance with the disclosure. MEMS devices in accordance with the disclosure can comprise a comb drive that is separated into two semiconductor layers with an insulating intermediate layer (cf. FIG. 5H). The separated semiconductor layers can be a monocrystalline layer and a polycrystalline layer. Such a separation into two semiconductor layers can break the symmetry of the positive and negatives angles discussed in association with FIG. 8. If the current charging e.g. of the upper layer of the stator (e.g. of the polycrystalline layer) is analyzed separately, it is possible to differentiate whether the MEMS scanner is at positive or negative angles. This is illustrated in FIG. 9, in which current signals are plotted for the upper layers of stators situated respectively on the left-hand and right-hand sides of the pivoting axis. It can be deduced from FIG. 9 that distinct current spikes occur at angles that deviate considerably from the zero position. These signal spikes shifted away from the zero crossing can be used to differentiate between positive and negative angles and for very precise amplitude closed-loop control. In contrast to conventional comb drive structures in which the rotor and the stator are both formed from only one layer of identical thickness, a part of a comb drive in accordance with the disclosure that is arranged on one side of the axis of rotation can accordingly have an asymmetrical electrical capacitance profile.

According to the statements above, MEMS devices in accordance with the disclosure can thus provide two technical effects, inter alia. Firstly, on account of the described layer construction of the comb drive, the MEMS devices can break a symmetry of the positive and negative angles and provide very precise amplitude closed-loop control, as described by way of example in association with FIG. 9. Secondly, spring elements of the MEMS devices can be fabricated completely from monocrystalline semiconductor material, whereby mechanical failure of the spring element can be avoided, as described by way of example in association with FIG. 5H.

EXAMPLES

MEMS devices and associated production methods are explained below based on examples.

Example 1 is a method for producing a MEMS device, wherein the method comprises: fabricating a first semiconductor layer; selectively depositing a second semiconductor layer over the first semiconductor layer, wherein the second semiconductor layer comprises a first part composed of monocrystalline semiconductor material and a second part composed of polycrystalline semiconductor material; and structuring at least one of the semiconductor layers, wherein the monocrystalline semiconductor material of the first part and underlying material of the first semiconductor layer form a spring element of the MEMS device and the polycrystalline semiconductor material of the second part and underlying material of the first semiconductor layer form at least one part of a comb drive of the MEMS device.

Example 2 is a method according to example 1, wherein selectively depositing the second semiconductor layer comprises: depositing an insulation layer over the first semiconductor layer; structuring the insulation layer, wherein a part of the first semiconductor layer is exposed; depositing the monocrystalline semiconductor material over the exposed part of the first semiconductor layer; and depositing the polycrystalline semiconductor material over the insulation layer.

Example 3 is a method according to example 2, wherein selectively depositing the second semiconductor layer comprises simultaneously epitaxially growing the monocrystalline semiconductor material over the first semiconductor layer and the polycrystalline semiconductor material over the insulation layer.

Example 4 is a method according to any of the preceding examples, wherein the first semiconductor layer is fabricated from monocrystalline semiconductor material.

Example 5 is a method according to any of the preceding examples, wherein the first semiconductor layer comprises a device layer of an SOI wafer.

Example 6 is a method according to any of the preceding examples, wherein the spring element formed is fabricated completely from monocrystalline semiconductor material.

Example 7 is a method according to any of the preceding examples, wherein the at least one part of the comb drive is formed by the polycrystalline semiconductor material of the second part and the underlying material of the first semiconductor layer in such a way that the comb drive or a part of the comb drive has an asymmetrical electrical capacitance profile.

Example 8 is a method according to any of the preceding examples, wherein structuring at least one of the semiconductor layers comprises: structuring the monocrystalline semiconductor material of the first part and the underlying material of the first semiconductor layer, wherein at least one rotor comb finger of the comb drive is formed, wherein the at least one rotor comb finger is fabricated completely from monocrystalline semiconductor material.

Example 9 is a method according to one of examples 1 to 7, wherein structuring at least one of the semiconductor layers comprises: structuring the polycrystalline semiconductor material of the second part and the underlying material of the first semiconductor layer, wherein at least one rotor comb finger of the comb drive is formed, wherein the at least one rotor comb finger is fabricated by way of a layer stack composed of polycrystalline semiconductor material and monocrystalline semiconductor material.

Example 10 is a method according to example 9, wherein a dimension of the polycrystalline semiconductor material in the layer stack and a dimension of the monocrystalline semiconductor material in the layer stack are substantially identical.

Example 11 is a method according to one of examples 2 to 10, wherein structuring at least one of the semiconductor layers comprises: structuring the polycrystalline semiconductor material of the second part, the underlying material of the insulation layer and the underlying material of the first semiconductor layer, wherein at least one stator comb finger of the comb drive is formed, wherein the at least one stator comb finger is fabricated by way of a layer stack composed of polycrystalline semiconductor material, material of the insulation layer and monocrystalline semiconductor material.

Example 12 is a method according to any of the preceding examples, furthermore comprising: forming a mirror body of the MEMS device by structuring at least the first semiconductor layer, wherein the mirror body is fabricated completely from monocrystalline semiconductor material.

Example 13 is a method according to example 12, wherein forming the mirror body comprises: removing the polycrystalline semiconductor material, wherein the insulation layer is exposed; removing the exposed insulation layer, wherein the first semiconductor layer is exposed; and structuring the exposed first semiconductor layer, wherein the mirror body is formed.

Example 14 is a method according to any of the preceding examples, wherein structuring at least one of the semiconductor layers comprises: structuring the polycrystalline semiconductor material of the second part, wherein at least one from the following is formed from the polycrystalline semiconductor material: an electrical contact pad for electrically contacting at least one stator comb finger of the comb drive or a mechanical contact pad for mechanical connection to a housing.

Example 15 is a method according to example 14, wherein the polycrystalline material of the stator comb finger, the polycrystalline material of the electrical contact pad and the polycrystalline material of the mechanical contact pad are electrically insulated from one another.

Example 16 is a method according to any of the preceding examples, wherein structuring at least one of the semiconductor layers comprises: structuring the first semiconductor layer, wherein a stiffening structure is formed, wherein the stiffening structure is fabricated completely from monocrystalline semiconductor material.

Example 17 is a method according to any of the preceding examples, wherein structuring at least one of the semiconductor layers comprises trench etching.

Example 18 is a method according to example 17, wherein the insulation layer functions as an etch stop layer during the trench etching.

Example 19 is a method according to one of examples 2 to 18, furthermore comprising: before depositing the polycrystalline semiconductor material over the insulation layer: depositing a seed layer over the insulation layer, wherein the polycrystalline semiconductor material is deposited over the seed layer.

Example 20 is a method according to example 19, wherein the seed layer extends 100 nanometers to 10 micrometers beyond the insulation layer.

Example 21 is a method according to one of examples 2 to 20, wherein depositing the insulation layer comprises: depositing a first insulation layer over the first semiconductor layer, wherein the first insulation layer substantially completely covers the first semiconductor layer; depositing a second insulation layer over the first insulation layer; and structuring the first insulation layer and the second insulation layer.

Example 22 is a method according to example 21, furthermore comprising: depositing a polysilicon layer between the first insulation layer and the second insulation layer, wherein the polysilicon layer provides an electrical connection between the stator comb finger and the electrical contact pad.

Example 23 is a MEMS device, comprising: a spring element, wherein the spring element is fabricated from a first semiconductor layer composed of first monocrystalline semiconductor material and a second monocrystalline semiconductor material, grown epitaxially over the first semiconductor layer; and a comb drive, wherein at least one part of the comb drive is fabricated from the first semiconductor layer composed of first monocrystalline semiconductor material and a polycrystalline semiconductor material grown epitaxially over the first semiconductor layer.

Example 24 is a MEMS device according to example 23, wherein the MEMS device is configured to operate as a MEMS scanner.

In the present description, the words "over" and "on" used for example with respect to a material layer that is formed "over" or "on" a surface of an object or is situated "over" or "on" the surface can be used in the sense that the material layer is arranged (for example formed, deposited, etc.) "directly on", for example in direct contact with, the surface meant. The words "over" and "on" used for example with respect to a material layer that is formed or arranged "over" or "on" a surface can also be used in the present text in the sense that the material layer is arranged (e.g. formed, deposited, etc.) "indirectly on" the surface meant, wherein for example one or more additional layers are situated between the surface meant and the material layer.

Although specific implementations have been illustrated and described herein, it is obvious to the person skilled in the art that a multiplicity of alternative and/or equivalent implementations can replace the specific implementations shown and described, without departing from the scope of the present disclosure. This application is intended to cover all adaptations or variations of the specific implementations discussed herein. Therefore, the intention is for this disclosure to be restricted only by the claims and the equivalents thereof.

The invention claimed is:

1. A method comprising:
fabricating a first semiconductor layer;
selectively depositing a second semiconductor layer over the first semiconductor layer, wherein the second semiconductor layer comprises a first part composed of monocrystalline semiconductor material and a second part composed of polycrystalline semiconductor material; and
structuring at least one of the first semiconductor layer or the second semiconductor layer, wherein the monocrystalline semiconductor material of the first part and underlying material of the first semiconductor layer form a spring element of a microelectromechanical system (MEMS) device and the polycrystalline semiconductor material of the second part and underlying material of the first semiconductor layer form at least one part of a comb drive of the MEMS device,
wherein the spring element comprises a single spring element formed from the first semiconductor layer and the second semiconductor layer without a gap between the first semiconductor layer and the second semiconductor layer.

2. The method as claimed in claim 1, wherein selectively depositing the second semiconductor layer comprises:
depositing an insulation layer over the first semiconductor layer;
structuring the insulation layer, wherein a part of the first semiconductor layer is exposed;
depositing the monocrystalline semiconductor material over the part of the first semiconductor layer that is exposed; and
depositing the polycrystalline semiconductor material over the insulation layer.

3. The method as claimed in claim 2, wherein selectively depositing the second semiconductor layer comprises simultaneously epitaxially growing the monocrystalline semiconductor material over the first semiconductor layer and the polycrystalline semiconductor material over the insulation layer.

4. The method as claimed in claim 1, wherein the first semiconductor layer is fabricated from monocrystalline semiconductor material.

5. The method as claimed in claim 1, wherein the first semiconductor layer comprises a device layer of a Silicon on Substrate (SOI) wafer.

6. The method as claimed in claim 1, wherein the spring element formed is fabricated completely from monocrystalline semiconductor material.

7. The method as claimed in claim 1, wherein the at least one part of the comb drive is formed by the polycrystalline semiconductor material of the second part and the underlying material of the first semiconductor layer in such a way that the comb drive or apart of the comb drive has an asymmetrical electrical capacitance profile.

8. The method as claimed in claim 1, wherein structuring at least one of the first semiconductor layer or the second semiconductor layer comprises:
structuring the monocrystalline semiconductor material of the first part and the underlying material of the first semiconductor layer, wherein at least one rotor comb finger of the comb drive is formed, wherein the at least one rotor comb finger is fabricated completely from monocrystalline semiconductor material.

9. The method as claimed in claim 1, wherein structuring at least one of the first semiconductor layer or the second semiconductor layer comprises:
structuring the polycrystalline semiconductor material of the second part and the underlying material of the first semiconductor layer, wherein at least one rotor comb finger of the comb drive is formed, wherein the at least one rotor comb finger is fabricated by way of a layer stack composed of polycrystalline semiconductor material and monocrystalline semiconductor material.

10. The method as claimed in claim 9, wherein a dimension of the polycrystalline semiconductor material in the layer stack and a dimension of the monocrystalline semiconductor material in the layer stack are substantially identical.

11. The method as claimed in claim 2, wherein structuring at least one of the first semiconductor layer or the second semiconductor layer comprises:
    structuring the polycrystalline semiconductor material of the second part, the underlying material of the insulation layer and the underlying material of the first semiconductor layer, wherein at least one stator comb finger of the comb drive is formed, wherein the at least one stator comb finger is fabricated by way of a layer stack composed of polycrystalline semiconductor material, material of the insulation layer and monocrystalline semiconductor material.

12. The method as claimed in claim 2, further comprising:
    forming a mirror body of the MEMS device by structuring at least the first semiconductor layer, wherein the mirror body is fabricated completely from monocrystalline semiconductor material.

13. The method as claimed in claim 12, wherein forming the mirror body comprises:
    removing the polycrystalline semiconductor material, wherein the insulation layer is exposed;
    removing the insulation layer that is exposed, wherein the first semiconductor layer is exposed; and
    structuring the exposed first semiconductor layer, wherein the mirror body is formed.

14. The method as claimed in claim 1, wherein structuring at least one of the first semiconductor layer or the second semiconductor layer comprises:
    structuring the polycrystalline semiconductor material of the second part, wherein at least one from the following is formed from the polycrystalline semiconductor material:
        an electrical contact pad for electrically contacting at least one stator comb finger of the comb drive, or
        a mechanical contact pad for mechanical connection to a housing.

15. The method as claimed in claim 14, wherein polycrystalline material of the at least one stator comb finger, polycrystalline material of the electrical contact pad and polycrystalline material of the mechanical contact pad are electrically insulated from one another.

16. The method as claimed in claim 1, wherein structuring at least one of the first semiconductor layer or the second semiconductor layer comprises:
    structuring the first semiconductor layer, wherein a stiffening structure is formed, wherein the stiffening structure is fabricated completely from monocrystalline semiconductor material.

17. The method as claimed in claim 1, wherein structuring at least one of the first semiconductor layer or the second semiconductor layer comprises trench etching.

18. The method as claimed in claim 17, wherein an insulation layer functions as an etch stop layer during the trench etching.

19. The method as claimed in claim 2, further comprising:
    before depositing the polycrystalline semiconductor material over the insulation layer:
    depositing a seed layer over the insulation layer, wherein the polycrystalline semiconductor material is deposited over the seed layer.

20. The method as claimed in claim 19, wherein the seed layer extends 100 nanometers to 10 micrometers beyond the insulation layer.

21. The method as claimed in claim 2, wherein depositing the insulation layer comprises:
    depositing a first insulation layer over the first semiconductor layer, wherein the first insulation layer substantially completely covers the first semiconductor layer;
    depositing a second insulation layer over the first insulation layer; and
    structuring the first insulation layer and the second insulation layer.

22. The method as claimed in claim 21, further comprising:
    depositing a polysilicon layer between the first insulation layer and the second insulation layer, wherein the polysilicon layer provides an electrical connection between a stator comb finger and an electrical contact pad.

23. A microelectromechanical system (MEMS) device, comprising:
    a first semiconductor layer;
    a second semiconductor layer selectively deposited over the first semiconductor layer,
        wherein the second semiconductor layer comprises a first part composed of monocrystalline semiconductor material and a second part composed of polycrystalline semiconductor material; and
    at least one of the first semiconductor layer or the second semiconductor layer structured, wherein the monocrystalline semiconductor material of the first part and underlying material of the first semiconductor layer form a spring element of the MEMS device and the polycrystalline semiconductor material of the second part and underlying material of the first semiconductor layer form at least one part of a comb drive of the MEMS device,
        wherein the spring element comprises a single spring element formed from the first semiconductor layer and the second semiconductor layer without a gap between the first semiconductor layer and the second semiconductor layer.

24. The MEMS device as claimed in claim 23, wherein the MEMS device is configured to operate as a MEMS scanner.

* * * * *